US009281227B2

(12) United States Patent
Lee et al.

(10) Patent No.: US 9,281,227 B2
(45) Date of Patent: Mar. 8, 2016

(54) MULTI-RESISTIVITY JOHNSEN-RAHBEK ELECTROSTATIC CLAMP

(71) Applicant: Axcelis Technologies, Inc., Beverly, MA (US)

(72) Inventors: William D. Lee, Newburyport, MA (US); Ashwin M. Purohit, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 132 days.

(21) Appl. No.: 13/930,220

(22) Filed: Jun. 28, 2013

(65) Prior Publication Data

US 2015/0002983 A1    Jan. 1, 2015

(51) Int. Cl.
*H01L 21/683* (2006.01)

(52) U.S. Cl.
CPC .................................. *H01L 21/6833* (2013.01)

(58) Field of Classification Search
USPC ......................................................... 361/234
See application file for complete search history.

(56) References Cited

U.S. PATENT DOCUMENTS

| | | | | |
|---|---|---|---|---|
| 5,903,428 A * | 5/1999 | Grimard | ............ | H01L 21/6833 279/128 |
| 6,104,595 A * | 8/2000 | Brown | ................ | H01L 21/6833 361/212 |
| 6,214,413 B1 * | 4/2001 | Brown | .......................... | 427/282 |
| 6,259,592 B1 * | 7/2001 | Ono | .................... | H01L 21/6831 279/128 |
| 7,352,554 B2 * | 4/2008 | Lagos | .......................... | 361/234 |
| 2002/0109955 A1 * | 8/2002 | Masuda et al. | ................ | 361/234 |
| 2002/0167779 A1 * | 11/2002 | Carroll et al. | .................. | 361/234 |
| 2002/0189940 A1 * | 12/2002 | Tsai et al. | ................. | 204/298.15 |
| 2002/0196596 A1 * | 12/2002 | Parkhe et al. | .................. | 361/234 |
| 2003/0033116 A1 * | 2/2003 | Brcka et al. | ..................... | 702/182 |
| 2003/0106647 A1 * | 6/2003 | Koshiishi et al. | ......... | 156/345.53 |
| 2007/0144554 A1 * | 6/2007 | Steger | .............................. | 134/1 |
| 2007/0214117 A1 * | 9/2007 | Shu | ................... | G06F 17/30445 |
| 2008/0100984 A1 * | 5/2008 | LaFontaine et al. | .......... | 361/234 |
| 2008/0142501 A1 * | 6/2008 | Morioka et al. | ........... | 219/444.1 |
| 2008/0144251 A1 * | 6/2008 | Tao et al. | ....................... | 361/234 |
| 2009/0284894 A1 * | 11/2009 | Cooke | ................. | H01L 21/6831 361/234 |
| 2010/0110603 A1 * | 5/2010 | LaFontaine et al. | .......... | 361/234 |
| 2010/0265631 A1 * | 10/2010 | Stone et al. | .................... | 361/234 |
| 2010/0321856 A1 * | 12/2010 | Peitzsch | ....................... | 361/234 |
| 2012/0141661 A1 * | 6/2012 | Cho | .................... | H01L 21/6833 427/58 |

* cited by examiner

*Primary Examiner* — Thienvu Tran
*Assistant Examiner* — Angela Brooks
(74) *Attorney, Agent, or Firm* — Eschweiler & Associates, LLC

(57) ABSTRACT

A Johnsen-Rahbek (J-R) electrostatic clamp is provided for clamping a workpiece, wherein the J-R clamp has a dielectric layer having a clamping surface associated with the workpiece and a backside surface generally opposing the clamping surface. The dielectric layer has a plurality of regions, wherein each of the plurality of regions comprises one of a plurality of dielectric materials. Each of the plurality of dielectric materials has a baseline resistivity that is different from the remainder of the plurality of dielectric materials, and each of the plurality of regions of the dielectric layer has a baseline resistivity that is different from the remainder of the plurality of regions of the dielectric layer. A plurality of electrically conductive electrodes are associated with the backside surface of the dielectric layer, wherein each of the plurality of electrically conductive electrodes are associated with one or more of the plurality of regions of the dielectric layer.

19 Claims, 5 Drawing Sheets

MULTI-RESISTIVITY JOHNSEN-RAHBEK ELECTROSTATIC CLAMP

FIELD

The present invention relates generally to semiconductor processing systems, and more specifically to a Johnsen-Rahbek electrostatic clamp having multiple resistivities associated therewith.

BACKGROUND

Electrostatic clamps or chucks (ESCs) are often utilized in the semiconductor industry for clamping substrates during plasma-based or vacuum-based semiconductor processes such as etching, CVD, and ion implantation, etc. Capabilities of the ESCs, including non-edge exclusion and wafer temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., ion implantation, plasma processing, etc.), a clamping voltage is typically applied between the wafer and the electrode, wherein the wafer is clamped against the chuck surface by electrostatic forces.

A subset of electrostatic clamps, referred to as Johnsen-Rahbek (J-R) clamps, utilize "leaky" dielectric layers (e.g., semiconductive dielectric layers having bulk resistances of between approximately $1\times10^9$ to $1\times10^{12}$ Ohm-cm) in contact with the wafer, wherein greater clamping forces can be achieved at lower voltages than with conventional Coulombic clamps. Lower voltage input to the ESC typically not only reduces power supply requirements associated with the J-R clamps, but further provides a clamping environment that is potentially less destructive to the wafer and devices formed thereon.

A conventional J-R clamp, for example, comprises a dielectric layer that is slightly conductive, thus generally permitting a thickness of the dielectric layer (e.g., a ceramic) to be much thicker than would be permitted for a "classic" or Coulombic ESC. Such an increase in thickness greatly facilitates the clamp manufacturing process, while also reducing clamp operating voltages. For example, the dielectric layer can be used as a base for the formation of positive and negative electrodes by screen printing and firing of a dielectric paste.

In some applications, processing of the wafer can occur at low temperatures (e.g., −50 C), while in other applications, processing of the wafer can occur at higher temperatures (e.g., 150 C). Conventionally, a single J-R clamp, however, cannot accommodate both extremes of temperature, as the resistivity of the dielectric layer changes with temperature. Thus, the clamping force exhibited by a conventional J-R clamp varies dramatically with temperature, thus yielding potential undesirable clamping effects.

SUMMARY

The present invention overcomes the limitations of the prior art by providing a J-R electrostatic clamp having multiple resistivities associated therewith. Consequently, the following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed generally toward a J-R electrostatic clamp (ESC) system for electrostatically clamping a workpiece such as a semiconductor wafer. The present invention is further directed toward a method for clamping a workpiece to the J-R ESC at a wide range of temperatures, wherein a predetermined clamping force is attained across the wide range of temperatures. In accordance with one exemplary aspect of the present invention, the ESC comprises a dielectric layer having a clamping surface whereon the wafer resides, and a backside surface generally opposite the clamping surface.

The dielectric layer, for example, comprises a plurality of regions, wherein each of the plurality of regions comprises one of a plurality of dielectric materials. Each of the plurality of dielectric materials has a baseline resistivity that is different from the remainder of the plurality of dielectric materials. The baseline resistivity, for example, comprises an electrical resistance measured at a predetermined temperature.

Accordingly, each of the plurality of regions of the dielectric layer has a baseline resistivity that is different from the remainder of the plurality of regions of the dielectric layer. A plurality of electrically conductive electrodes are further associated with the backside surface of the dielectric layer, wherein each of the plurality of electrically conductive electrodes are associated with one or more of the plurality of regions of the dielectric layer. The distribution of the plurality of electrodes with respect to the plurality of regions of the dielectric layer, for example, advantageously permits a uniform electrostatic clamping of the wafer at a large range of temperatures.

According to one example, the plurality of regions of the dielectric layer are arranged in a first pattern, and wherein the plurality of electrically conductive electrodes are arranged in a second pattern. In one example, the first pattern and second pattern are generally congruent, wherein each of the plurality of electrically conductive electrodes are associated with a respective one of the plurality of regions of the dielectric layer. In another example, the first pattern and second pattern overlap one another, wherein two or more of the plurality of regions of the dielectric layer are associated with one of the plurality of electrically conductive electrodes. Accordingly, one or more of the plurality of regions of the dielectric layer can be selectively utilized to attract the workpiece to the clamping surface, based on, for example, the operating temperature of the ESC. In another example, one or more of the plurality of regions comprises two or more of the plurality of dielectric materials.

In accordance with another example, the J-R electrostatic clamping system further comprises a power supply operably coupled to the plurality of electrically conductive electrodes, wherein the power supply is configured to selectively energize each of the plurality of electrodes. For example, the resistivity of each of the plurality of dielectric materials is associated with a respective temperature at which a clamping force associated with the respective dielectric material falls below a predetermined threshold when the plurality of electrodes are energized at a predetermined voltage. The power supply, for example, is configured to selectively energize each of the plurality of electrodes based on a temperature of the dielectric layer.

In accordance with yet another example, one or more holes are provided through the dielectric layer, and wherein the dielectric layer comprises one or more gas distribution channels associated with the clamping surface. Accordingly, the one or more holes generally permit a flow of gas therethrough to the one or more gas distribution channels.

A method for electrostatically clamping a workpiece is further provided, wherein a first process environment at a first temperature is provided. A first electrode associated with a first region of a J-R electrostatic clamp is energized, wherein the first region comprises a first dielectric material having a first baseline resistivity. The energizing of the first electrode therein electrostatically attracts the workpiece to the J-R electrostatic clamp with a predetermined clamping force at the first temperature. A second process environment at a second temperature is further provided, wherein the second temperature is lower than the first temperature. A second electrode associated with a second region of the J-R electrostatic clamp is further energized, wherein the second region comprises a second dielectric material having a second baseline resistivity that is different from the first baseline resistivity. Accordingly, the workpiece is attracted to the J-R electrostatic clamp at the second temperature, wherein the predetermined clamping force is maintained by the second dielectric material at the second temperature.

Thus, to the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of a few of the various ways in which the principles of the invention may be employed. Other objects, advantages and novel features of the invention will become apparent from the following detailed description of the invention when considered in conjunction with the drawings.

DETAILED DESCRIPTION

Figure 1:
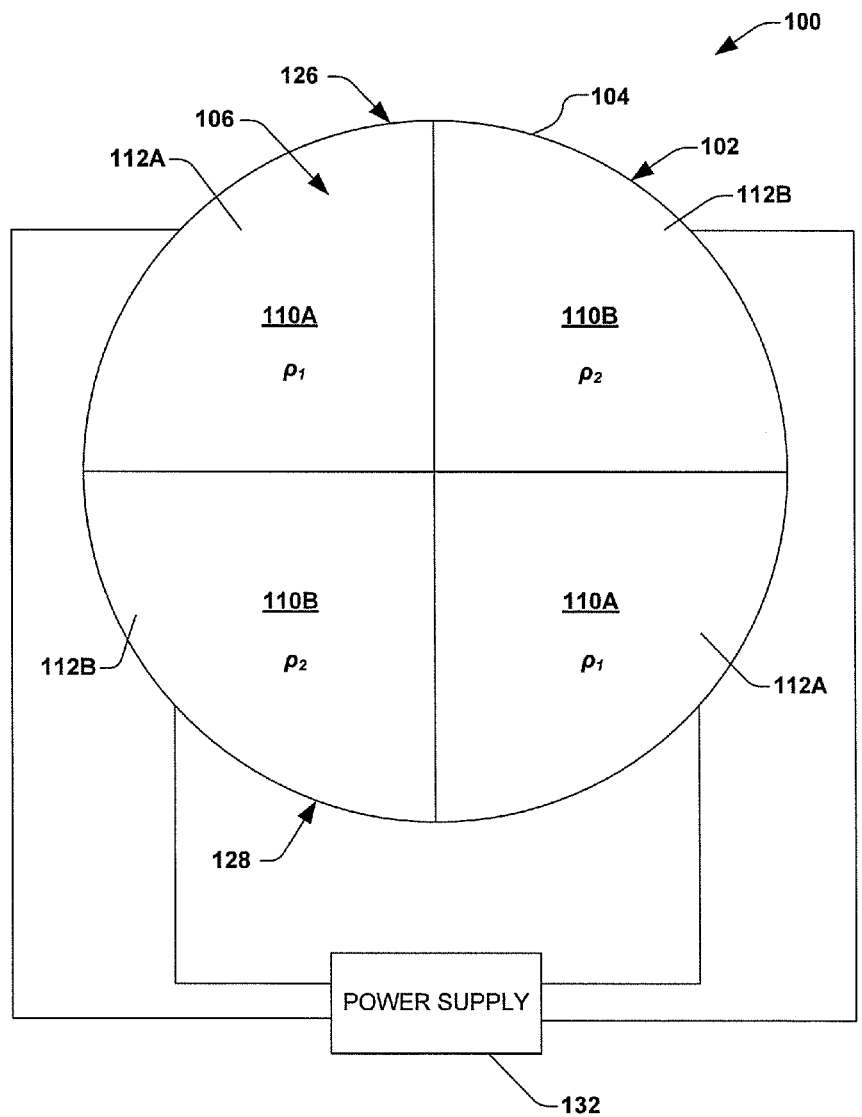
FIG. 1 is a plan view of an exemplary J-R electrostatic clamp according to one exemplary aspect of the present disclosure.

The present invention is directed generally towards an electrostatic clamp for maintaining a position of a workpiece such as a semiconductor substrate or wafer. More particularly, the invention is directed toward a Johnsen-Rahbek (J-R) electrostatic clamp and method of operating same, wherein the J-R clamp is operable to provide a uniform and reliable clamping force over a wide range of process temperatures. The present disclosure is particularly useful in ion implantations over a wide range of process temperatures (e.g., −50 C to 150 C).

Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Referring now to the figures, FIG. 1 illustrates a schematic representation of an exemplary electrostatic clamping system 100 according to one exemplary aspect of the disclosure. The electrostatic clamping system 100, for example, comprises a Johnsen-Rahbek (J-R) electrostatic clamp 102, also referred to as an "ESC". The J-R ESC 102 is operable to substantially clamp a workpiece (not shown), such as a semiconductor wafer, thereto by electrostatic force. The J-R ESC 102, for example, comprises a dielectric layer 104 having a clamping surface 106 associated therewith, wherein the wafer (not shown) generally resides over the clamping surface during electrostatic clamping. The dielectric layer 104, for example, is comprised of one or more doped J-R type ceramic substrates (e.g., alumina doped with titanium, aluminum nitride doped with cerium oxide, or the like), as will be further discussed infra. A doped J-R ceramic substrate (e.g., a semi-conductive dielectric material having a bulk resistance between $1 \times 10^8$ to $1 \times 10^{12}$ Ohm-cm) has an advantage over non-doped materials because the substrate can be substantially thick (e.g., a thickness of 0.5 mm or more), and does not require subsequent thinning by machining, grinding, or other techniques in order to produce useful clamping forces. Alternatively, the dielectric layer 104 is comprised of a fired dielectric paste or a cured dielectric epoxy. In one example, the plurality of dielectric materials comprise one or more of titania-doped alumina, cerium oxide-doped aluminum nitride, and other doped aluminum nitride materials.

Figure 2:
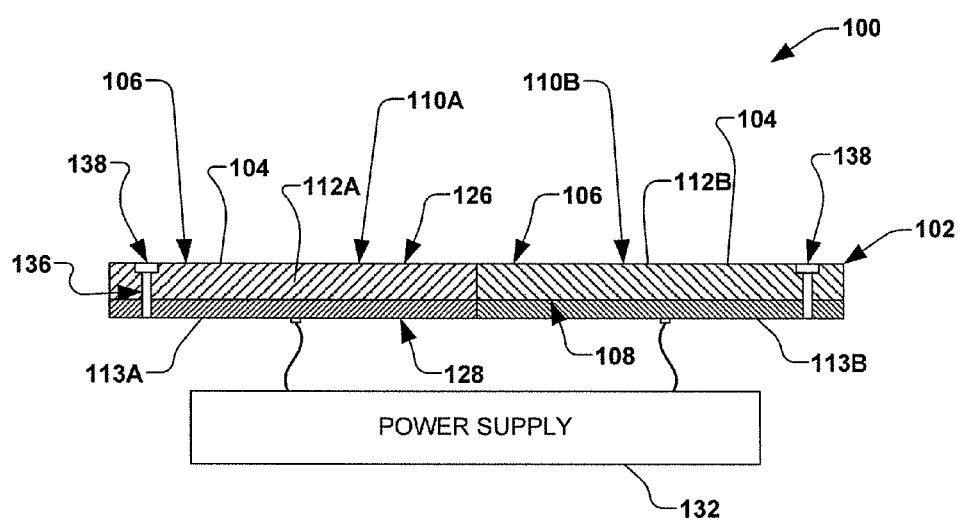
FIG. 2 is a partial cross-sectional view of another exemplary J-R electrostatic clamp according to another aspect of the present disclosure.

FIG. 2 illustrates a partial cross-sectional view of the J-R ESC 102, wherein the dielectric layer 104 further comprises a backside surface 108 that is generally opposite the clamping surface 106. The dielectric layer 104, for example, comprises a plurality of regions 110. In the present example, two regions 110A, 110B are illustrated, however, any number n of regions 100 is contemplated, where n is any positive integer. Each of the plurality of regions 110, for example, comprises one of a plurality of dielectric materials 112, wherein each of the plurality of dielectric materials has a baseline resistivity range ρ that is different from the remainder of the plurality of dielectric materials. For example, dielectric material 112A has a baseline resistivity $\rho_1$ and dielectric material 112B has a baseline resistivity $\rho_2$, as illustrated in FIG. 1. Accordingly, each of the plurality of regions 110 of the dielectric layer 104 has a baseline resistivity range ρ that is different from the remainder of the plurality of regions of the dielectric layer, although some overlap can also be advantageous.

The baseline resistivity range ρ of each of the plurality of dielectric materials 112, for example, is associated with a respective temperature range at which a clamping force associated with the respective dielectric material falls within a predetermined threshold when the plurality of electrodes are energized at a predetermined voltage V. In other words, the baseline resistivity ρ, for example, comprises an electrical resistance across the dielectric layer 104 that is measured over a range of predetermined temperatures.

FIG. 2 further illustrates plurality of electrically conductive electrodes 113 arranged across the backside surface 108 of the dielectric layer 104. According to one example, the plurality of electrodes 113 are comprised of one or more of silver, an alloy of silver, gold, and an alloy of gold, however, other electrically conductive materials can also be used, and all such alternative materials are contemplated as falling within the scope of the present invention.

Each of the plurality of electrically conductive electrodes 113, for example, are associated with one or more of the plurality of regions 110 of the dielectric layer 104. For example, electrically conductive electrode 113A is associated with region 110A, and electrically conductive electrode 113B is associated with region 110B, wherein the respective electrically conductive electrode is configured to be energized in order to induce a clamping force though the respective dielectric material 112A and 112B associated with each respective region.

Figure 3:
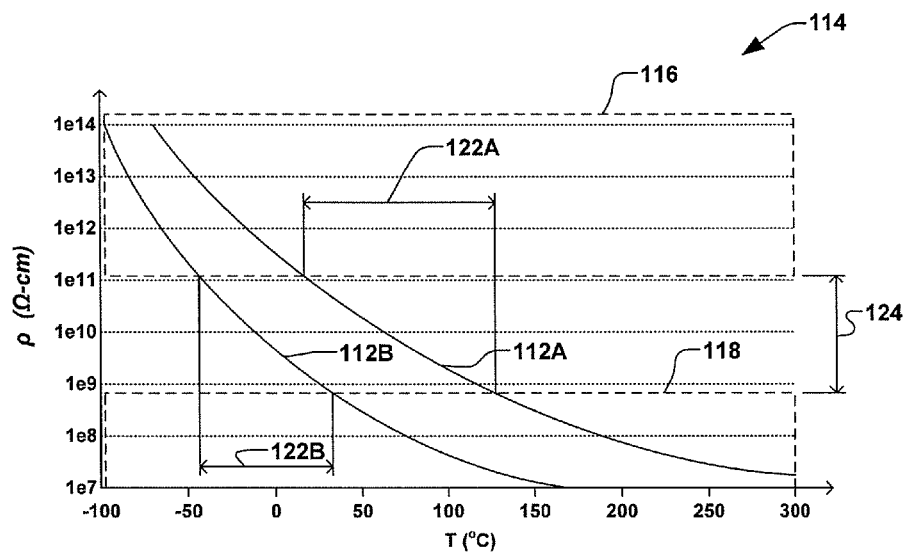
FIG. 3 is a graph illustrating resistivity versus temperature for two dielectric materials according to an aspect of the present disclosure.
Figure 4:
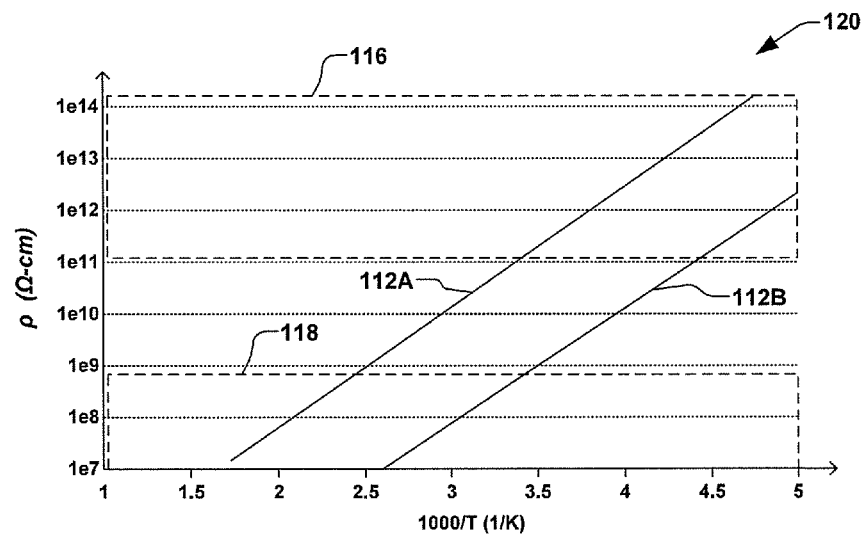
FIG. 4 is a graph illustrating a logarithmic resistivity versus temperature for two dielectric materials according to another aspect of the present disclosure.

In order to provide a further understanding of the disclosure, FIG. 3 illustrates an exemplary graph 114 of the resistivity ρ versus temperature T for two dielectric materials 112A, 112B. As can be seen in the graph 114, a too-resistive regime 116 is evidenced above approximately 1e11 Ω-cm, while a too-conductive regime 118 is evidenced below approximately 1.7e8 Ω-cm. Some materials can have relatively flat resistivity ρ, however, most dielectric materials have a log dependence on temperature, such as illustrated in chart 120 of FIG. 4. As such, in general, there is a finite range of resistivity ρ, as the slope of the lines for dielectric materials 112A, 112B of FIG. 4 translates to a finite temperature range through which a particular dielectric material will suffice for electrostatic clamping while not being in the too-resistive regime 116 or too-conductive regime 118.

Thus, in order to broaden the effective range of clamping for the J-R ESC 102 of FIGS. 1 and 2, a plurality of dielectric materials 112 are provided in the dielectric layer 104. As such, one dielectric material (e.g., dielectric material 112A) is configured to operate in a first temperature range 122A, and another dielectric material (e.g., dielectric material 112B) is configured to operate in a second temperature range 122B, while both operating in relatively the same resistivity range 124, as illustrated in FIG. 3. In the present example, dielectric material 112B operates in a lower temperature range (e.g., −40 C to +30 C), and dielectric material 112A operates in a higher temperature range (e.g., +20 C to +140 C).

Accordingly, in the present example, the J-R ESC 102 of FIG. 1, for example, can be utilized in a cold process (e.g., a "cold" ion implantation wherein the J-R ESC is cooled significantly below room temperature) by energizing electrically conductive electrode 113B associated with region 110B, wherein the dielectric material 112B is selected for such low temperature operation. Likewise, the same J-R ESC 102 can be utilized in a higher temperature process (e.g., an ion implantation wherein the J-R ESC is at or significantly above room temperature) by energizing electrically conductive electrode 113A associated with region 110A. Again, the dielectric material 112A can likewise be selected for such a higher temperature operation.

The present disclosure appreciates that the dielectric material 112A can be suitably utilized at lower temperatures (e.g., in the above-stated second temperature range 122B), however, lower J-R clamping forces may be evidenced. The dielectric material 112B, on the other hand, can exhibit problems when operated at higher temperatures (e.g., in the first temperature range 122A), as the resistivity ρ may become too low, and leakage current associated with the dielectric layer 104 becomes too high. Theoretically, a larger current can flow through the dielectric material 112B, however, practically, some current limit is typically present, where the current limit cannot be realistically exceeded.

In accordance with another aspect of the disclosure, as illustrated in the example of FIG. 1, the plurality of regions 110 of the dielectric layer 104 are arranged in a first pattern 126, and wherein the plurality of electrically conductive electrodes are arranged in a second pattern 128. In one example, the first pattern 126 and second pattern 128 are generally congruent, wherein each of the plurality of electrically conductive electrodes 113 are associated with a respective one of the plurality of regions 110 of the dielectric layer 104. In another example, the first pattern 126 and second pattern 128 overlap one another, wherein two or more of the plurality of regions 110 of the dielectric layer 104 are associated with one or more of the plurality of electrically conductive electrodes 113. As such, overlap between the first and second patterns 126 and 128 can provide an overlap between the first and second temperature ranges 122A and 122B of FIG. 3.

While the example of in FIGS. 1 and 2 illustrates two regions 110A and 110B, the present disclosure contemplates any number of regions 110, wherein each region is associated a respective temperature range 122 of FIG. 3. For example, three different dielectric materials 112 can be selected to efficiently operate within three different temperature ranges 122. Overlap between the temperature ranges can provide flexibility in operation of the J-R ESC, however overlap between all temperature ranges may not be required.

Figure 5:
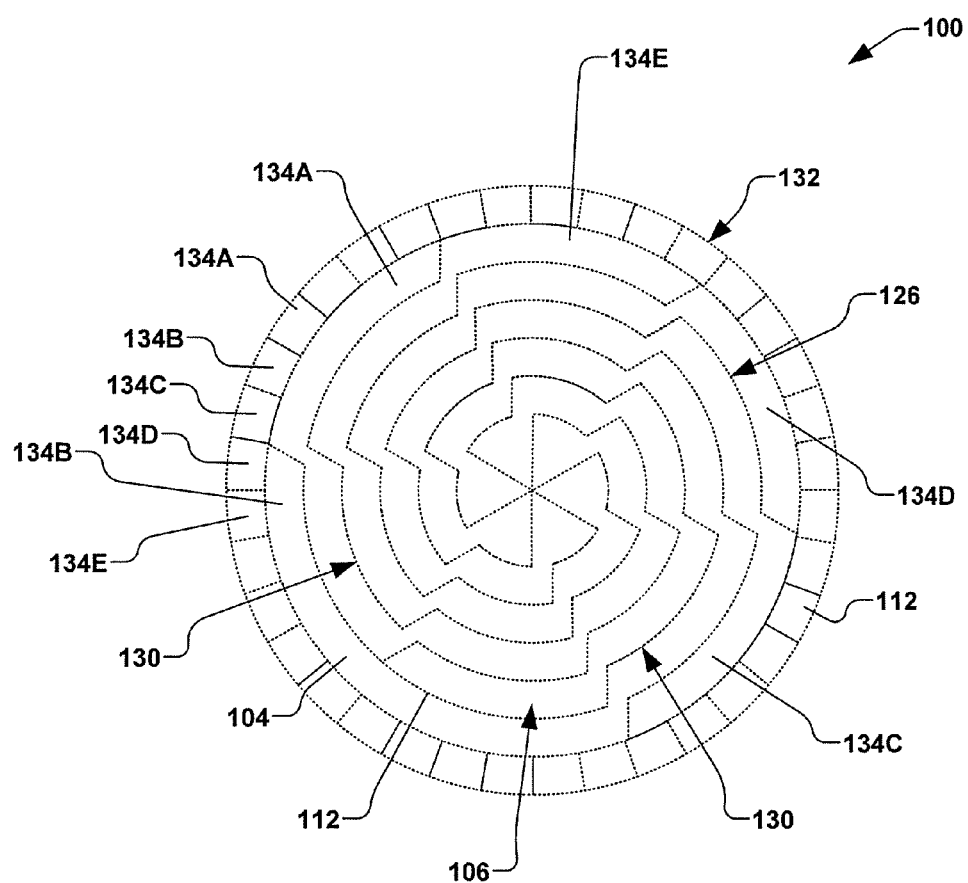
FIG. 5 is a plan view of another exemplary J-R electrostatic clamp according to yet another aspect of the present invention.

FIG. 5 illustrates another example of the present disclosure, wherein the first pattern 126 of the dielectric layer 104 is generally distributed about an interior region 130 and a peripheral region 132 of the clamping surface 106. Likewise, while not shown in FIG. 5, the second pattern 128 of FIG. 2 of the plurality of electrically conductive electrodes 113 residing beneath the dielectric layer 104 may be similar to the first pattern 126 of FIG. 5, wherein each electrode in the interior region 130 is associated with a respective one or more electrodes in the peripheral region 132, therein generally defining a plurality n of electrode regional groups 134A-134n.

It should be noted that the first pattern 126 and second pattern 128 illustrated in FIG. 2 and electrode regional groups 134A-134n of FIG. 5 can differ from that illustrated in the figures, and all such patterns are contemplated as falling within the scope of the present invention. It should be further noted that the J-R ESC 102 may comprise any number of regional groups 134 (e.g., a larger number of electrode groups to provide a more distributed electrostatic force on the workpiece), and all such regional groups are further contemplated as falling within the scope of the present invention. In various alternatives, the first pattern 126 can be substantially pie-shaped, circular about the center of the ESC 100, or any other shape. Likewise, the second pattern 128 of the plurality of electrodes 113 can be of any shape or number, and all such shapes and numbers of electrodes 113 associated with the plurality of dielectric materials 112 are contemplated as falling with the scope of the present invention.

Further, again referring to FIGS. 1 and 2, the plurality of electrically conductive electrodes 113 are further operably coupled a power supply 132, wherein the power supply is configured to selectively energize each of the plurality of electrodes. Accordingly, as discussed above, the power supply 132 is configured to selectively energize one or more of the plurality of electrodes 113 based on a temperature of the dielectric layer 104. The power supply 132, for example, can be configured to provide alternating current (A/C) or direct current (D/C) to the plurality of electrodes 113.

In accordance with another example illustrated in FIG. 2, the dielectric layer 104 may further comprise one or more gas holes 136 and one or more distribution channels 138 formed therein, such as by machining the ceramic substrate, wherein gas cooling of the workpiece (not shown) can be achieved during operation of the J-R ESC 102. The one or more holes 136 and one or more gas distribution channels 138 are associated with the clamping surface 106, and wherein the one or more holes generally permit a flow of gas therethrough to the one or more gas distribution channels.

Figure 6:
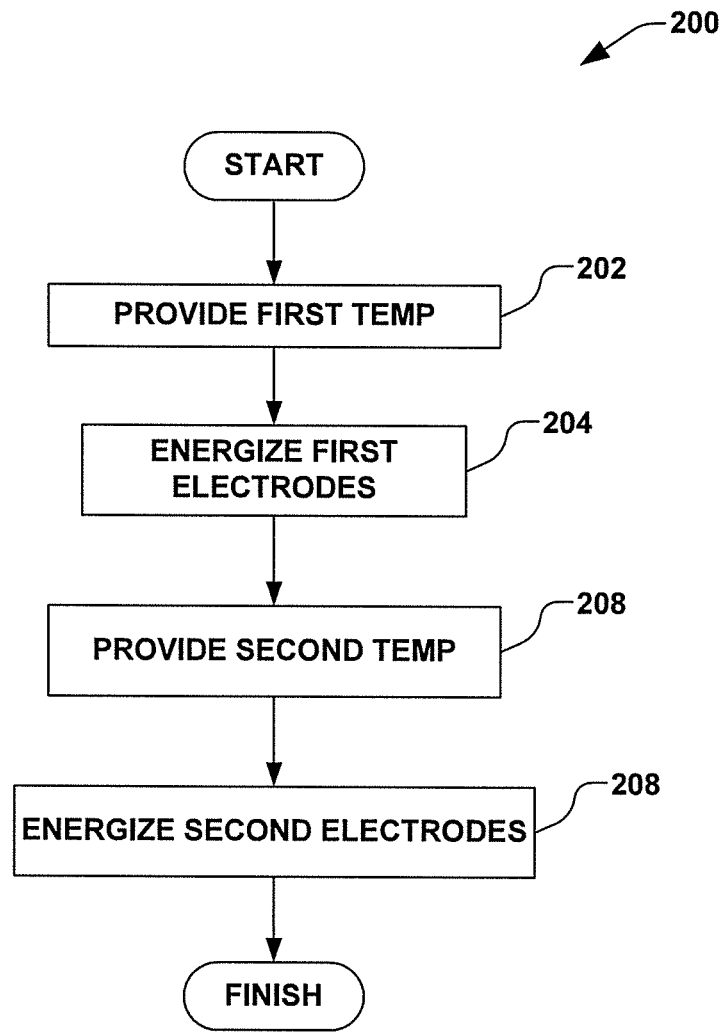
FIG. 6 is a block diagram of a method for electrostatically clamping a workpiece according to another exemplary aspect of the invention.

According to still another exemplary aspect of the present invention, FIG. 6 is a schematic block diagram of an exemplary method 200 illustrating a method of electrostatically clamping a workpiece to a J-R electrostatic chuck over a wide range of temperatures. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

As illustrated in FIG. 6, the method 200 comprises providing a first process environment at a first temperature in act 202. In act 204, a first electrode associated with a first region of a J-R electrostatic clamp is energized, wherein the first region comprises a first dielectric material having a first baseline resistivity. Accordingly, the workpiece is electrostatically attracted to the J-R electrostatic clamp with a predetermined clamping force at the first temperature.

In act 206, a second process environment is provided at a second temperature, wherein the second temperature is lower than the first temperature. Accordingly, in act 208, a second electrode associated with a second region of the J-R electrostatic clamp is energized, wherein the second region comprises a second dielectric material having a second baseline resistivity that is different from the first baseline resistivity. Accordingly, the workpiece is attracted to the J-R electrostatic clamp with the predetermined clamping force at the second temperature.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

It is claimed:

1. A Johnsen-Rahbek (J-R) electrostatic clamp for clamping a workpiece, the electrostatic clamp comprising:
a dielectric layer having a clamping surface associated with the workpiece and a backside surface generally opposing the clamping surface, wherein the dielectric layer comprises a plurality of regions extending between the clamping surface and the backside surface, and wherein each of the plurality of regions comprises one of a plurality of dielectric materials, wherein each of the plurality of dielectric materials has a baseline resistivity that is different from the remainder of the plurality of dielectric materials, and wherein each of the plurality of regions of the dielectric layer has a baseline resistivity that is different from the remainder of the plurality of regions of the dielectric layer; and
a plurality of electrically conductive electrodes associated with the backside surface of the dielectric layer, wherein each of the plurality of electrically conductive electrodes are associated with one or more of the plurality of regions of the dielectric layer.

2. The J-R electrostatic clamp of claim 1, wherein the baseline resistivity comprises an electrical resistance measured over a range of predetermined temperatures.

3. The J-R electrostatic clamp of claim 1, wherein the plurality of regions of the dielectric layer are arranged in a first pattern, and wherein the plurality of electrically conductive electrodes are arranged in a second pattern.

4. The J-R electrostatic clamp of claim 3, wherein the first pattern and second pattern are generally congruent, wherein each of the plurality of electrically conductive electrodes are associated with a respective one of the plurality of regions of the dielectric layer.

5. The J-R electrostatic clamp of claim 3, wherein the first pattern and second pattern overlap one another, wherein two or more of the plurality of regions of the dielectric layer are associated with one of the plurality of electrically conductive electrodes.

6. The J-R electrostatic clamp of claim 1, wherein one or more of the plurality of regions comprises two or more of the plurality of dielectric materials.

7. The J-R electrostatic clamp of claim 1, wherein the plurality of electrically conductive electrodes are arranged across the backside surface of the dielectric layer.

8. The J-R electrostatic clamp of claim 1, wherein the workpiece resides on the clamping surface.

9. The J-R electrostatic clamp of claim 1, wherein the plurality of dielectric materials comprise a plurality of ceramic materials.

10. The J-R electrostatic clamp of claim 9, wherein the dielectric layer is comprised of a fired dielectric paste or a cured dielectric epoxy.

11. The J-R electrostatic clamp of claim 1, wherein the plurality of dielectric materials comprise titania-doped alumina and cerium oxide-doped aluminum nitride.

12. The J-R electrostatic clamp of claim 1, wherein a thickness of the dielectric layer is 0.5 mm or more.

13. The J-R electrostatic clamp of claim 1, wherein the plurality of electrodes comprise one or more of silver, an alloy of silver, gold, and an alloy of gold.

14. The J-R electrostatic clamp of claim 1, further comprising one or more holes through the dielectric layer, and wherein the dielectric layer comprises one or more gas distribution channels associated with the clamping surface, and wherein the one or more holes generally permit a flow of gas therethrough to the one or more gas distribution channels.

15. The J-R electrostatic clamp of claim 1, wherein the resistivity of each of the plurality of dielectric materials is associated with a respective temperature at which a clamping force associated with the respective dielectric material falls below a predetermined threshold when the plurality of electrodes are energized at a predetermined voltage.

16. An electrostatic clamping system for clamping a workpiece, the electrostatic clamping system comprising:

a Johnsen-Rahbek (J-R) electrostatic clamp for clamping a workpiece, the electrostatic clamp comprising:

a dielectric layer having a clamping surface associated with the workpiece and a backside surface generally opposing the clamping surface, wherein the dielectric layer comprises a plurality of regions extending between the clamping surface and the backside surface, and wherein each of the plurality of regions comprises one of a plurality of dielectric materials, wherein each of the plurality of dielectric materials has a baseline resistivity that is different from the remainder of the plurality of dielectric materials, and wherein each of the plurality of regions of the dielectric layer has a baseline resistivity that is different from the remainder of the plurality of regions of the dielectric layer; and a plurality of electrically conductive electrodes associated with the backside surface of the dielectric layer, wherein each of the plurality of electrically conductive electrodes are associated with one or more of the plurality of regions of the dielectric layer; and a power supply operably coupled to the plurality of electrically conductive electrodes, wherein the power supply is configured to selectively energize each of the plurality of electrodes.

17. The electrostatic clamping system of claim 16, wherein the resistivity of each of the plurality of dielectric materials is associated with a respective temperature at which a clamping force associated with the respective dielectric material falls below a predetermined threshold when the plurality of electrodes are energized at a predetermined voltage.

18. The electrostatic clamping system of claim 16, wherein the power supply is configured to selectively energize each of the plurality of electrodes based on a temperature of the dielectric layer.

19. A method electrostatically clamping a workpiece, the method comprising:

providing a first process environment at a first temperature;

energizing a first electrode associated with a first region of a J-R electrostatic clamp, wherein the first region comprises a first dielectric material having a first baseline resistivity, therein attracting the workpiece to the J-R electrostatic clamp with a predetermined clamping force at the first temperature;

providing a second process environment at a second temperature, wherein the second temperature is lower than the first temperature; and energizing a second electrode associated with a second region of the J-R electrostatic clamp, wherein the second region comprises a second dielectric material having a second baseline resistivity that is different from the first baseline resistivity, therein attracting the workpiece to the J-R electrostatic clamp with the predetermined clamping force at the second temperature.

\* \* \* \* \*